United States Patent
Biondo et al.

(10) Patent No.: US 8,384,358 B2
(45) Date of Patent: Feb. 26, 2013

(54) SYSTEMS AND METHODS FOR ELECTRIC VEHICLE CHARGING AND FOR PROVIDING NOTIFICATION OF VARIATIONS FROM CHARGING EXPECTATIONS

(75) Inventors: William A. Biondo, Beverly Hills, MI (US); Clark E. McCall, Ann Arbor, MI (US); David T. Proefke, Madison Heights, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 328 days.

(21) Appl. No.: 12/473,689

(22) Filed: May 28, 2009

(65) Prior Publication Data

US 2010/0301810 A1    Dec. 2, 2010

(51) Int. Cl.
*H02J 7/16* (2006.01)
*H02J 7/04* (2006.01)
(52) U.S. Cl. .................. 320/155; 320/157; 320/162
(58) Field of Classification Search .................. None
See application file for complete search history.

(56) References Cited

U.S. PATENT DOCUMENTS

| 5,422,822 | A  | * | 6/1995 | Toyota et al. | 702/63 |
|---|---|---|---|---|---|
| 5,479,085 | A  | * | 12/1995 | Honda et al. | 320/134 |
| 7,493,140 | B2 | * | 2/2009 | Michmerhuizen et al. | 455/552.1 |
| 7,639,019 | B2 | * | 12/2009 | Bosse et al. | 324/426 |
| 7,714,736 | B2 | * | 5/2010 | Gielniak | 340/636.1 |
| 2007/0200668 | A1 | * | 8/2007 | Kurpinski et al. | 340/5.64 |

* cited by examiner

*Primary Examiner* — Vinh Nguyen
(74) *Attorney, Agent, or Firm* — Ingrassia Fisher & Lorenz, P.C.

(57) ABSTRACT

Methods and systems are provided to charge a vehicle battery from an external power source. The system includes a sensor configured to detect an electrical current received from the external power source and a processor configured to determine a charging schedule related to charging the vehicle battery. The processor is also configured to determine a variation from the charging schedule based on the electrical current and to direct transmissions of messages based on the electrical current detected by the sensor. The system includes a remote electronic device configured to receive the messages and to alert a driver of the plug-in vehicle based on the messages.

20 Claims, 2 Drawing Sheets

SYSTEMS AND METHODS FOR ELECTRIC VEHICLE CHARGING AND FOR PROVIDING NOTIFICATION OF VARIATIONS FROM CHARGING EXPECTATIONS

TECHNICAL FIELD

This document generally relates to plug-in vehicles such as electric and hybrid-electric vehicles, and more particularly relates to systems and methods for alerting a driver to problems with charging a plug-in vehicle.

BACKGROUND

Plug-in electric vehicles including electric, hybrid-electric and range-extended vehicles conventionally have a vehicle battery that can be recharged from a wall outlet or other external power source. The vehicle battery is used to power a motor that propels the vehicle. The battery typically needs to be recharged regularly. Recharging is typically performed without a person present, so if a problem occurs while recharging, the driver may not discover the problem until it is time to use the vehicle. By that time, however, the uncharged vehicle may not be ready for use. Recharging a plug in vehicle, which is a form of refueling, can take several hours, so it is often done while the vehicle is unattended. Unattended charging also allows the vehicle to be charged at convenient times, such as late at night when electricity is less expensive. Problems can occur while recharging a vehicle battery resulting from problems with the electrical supply, electrical connections, tampering, incorrect metering, and/or the like.

SUMMARY

A system is provided to charge a vehicle battery from an external power source. The system includes a sensor configured to detect an electrical current received from the external power source and a processor configured to determine a charging expectation related to charging the vehicle battery. The processor is also configured to determine a variation from the charging expectation based on the electrical current and to direct transmissions of messages based on the electrical current detected by the sensor. The system includes a remote electronic device configured to receive the messages and to alert a driver of the plug-in vehicle based on the messages.

A computer-implemented method is provided for charging a battery in an electric vehicle. The method comprises identifying, by a computer, an expectation of a vehicle charge and detecting an ability to meet the expectation based on a sensed electrical characteristic. If the ability to meet the expectation is not detected, a message is transmitted from the computer to the driver.

DESCRIPTION OF THE DRAWINGS

A more complete understanding of the subject matter may be derived by referring to the detailed description and claims when considered in conjunction with the following figures, wherein like numerals denote like elements.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

In one embodiment, a driver enters parameters for a charging schedule stored in an onboard processor. The driver enters the parameters through devices coupled to an onboard communication system or through an onboard interface. Using the parameters, the processor creates a charging schedule, and determines whether the vehicle battery can be recharged according to the schedule. If the vehicle battery cannot be recharged according to the schedule, then an alert is sent to the driver. The processor periodically receives a signal from onboard sensor before the scheduled start time to determine if the vehicle is connected to an external power source for recharging the vehicle battery. If the onboard sensor does not detect a proper power connection, then the processor directs the communication system to alert the driver that power is not available and that charging will not begin as scheduled.

A charging system may also notify the driver when other problems occur based on set parameters for expected events and characteristics that occur during a recharging cycle. When there is a deviation from the set parameters, an alert is sent to a driver. The driver receives the alert through an electronic device so that he or she can take action to correct the problem.

Figure 1:
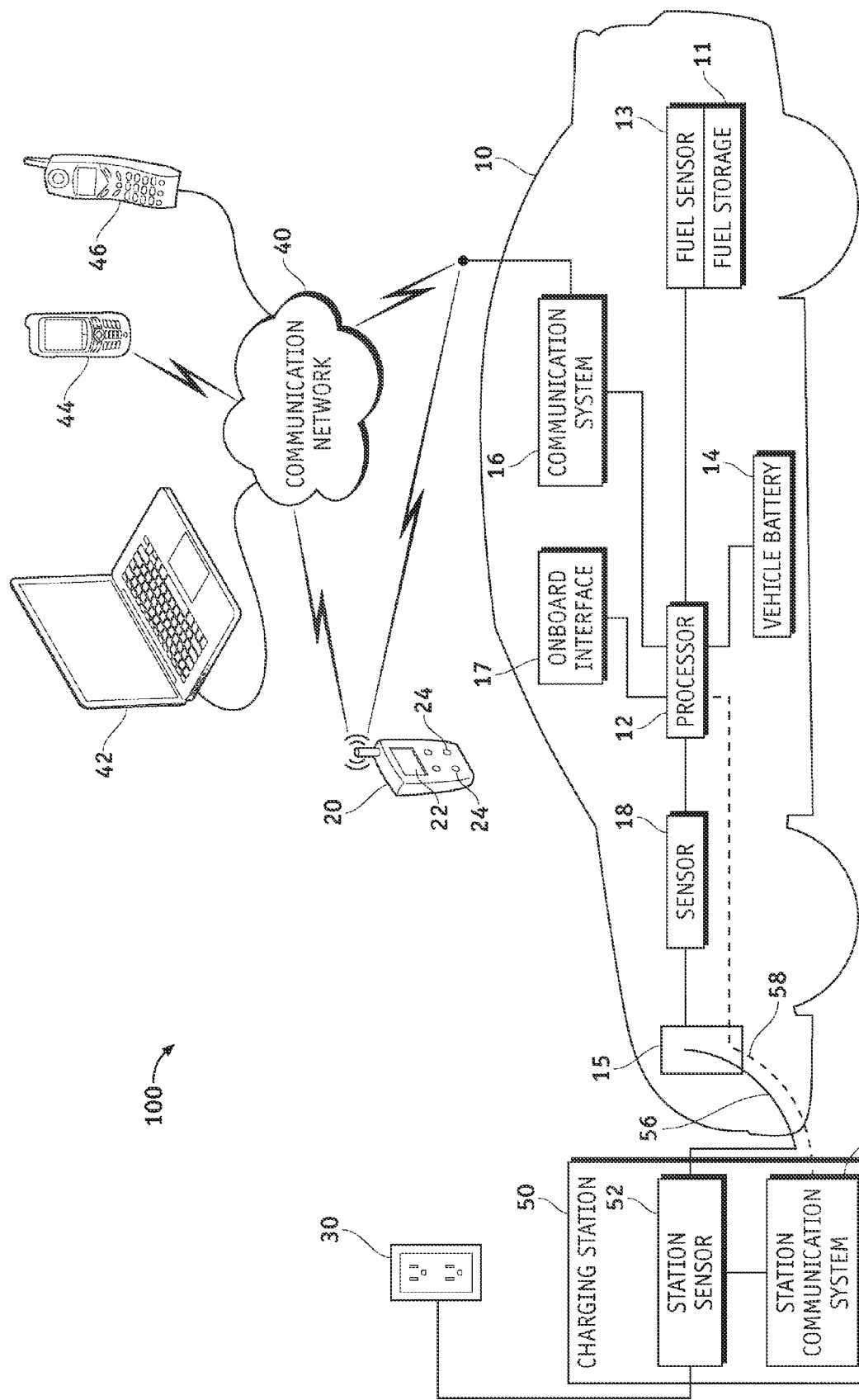
FIG. 1 is a simplified diagram of an exemplary system for charging a vehicle battery with a communication system to alert a driver of charging problems.

FIG. 1 is a block diagram of a system 100 for alerting a driver when certain conditions occur while charging. In the exemplary embodiment, system 100 is implemented with a vehicle 10 and suitably includes a processor 12. Processor 12 may be a single processor in an onboard computer system, or multiple processors coupled together and configured to perform functions individually.

In the exemplary embodiment, processor 12 is configured to receive information from vehicle battery 14. Vehicle battery 14 is any energy storage device for operating plug-in vehicle 10 that can be recharged from an external power source. In one embodiment vehicle battery 14 is a multi-cell battery used to power a motor in a powertrain of plug-in vehicle 10. Processor 12 may control the charging of vehicle battery 14 using battery characteristics such as voltage, resistance, and temperature. In the exemplary embodiment, processor 12 determines a state of charge (SOC) and a state of health (SOH) as well as other characteristics of vehicle battery 14.

A communication system 16 is also coupled to onboard processor 12. In the exemplary embodiment processor 12 directs communication system 16 to transmit a message to the driver under predetermined charging conditions such as a power failure. The message may be transmitted to the driver in several ways. Communication system 16, for example, may communicate with a communication network 40 to direct messages to one device or multiple devices. In the exemplary embodiment communication network 40 is coupled to a computer 42, a cell phone 44, a telephone 46, and electronic key fob 20. A communication network 40 may include a cellular telephone network and/or a satellite communication network. In other embodiments, communication system 16 communicates directly with electronic key fob 20, for example using a short range RF transmitter.

Input from the driver may be received through communication system 16 using the same systems for transmitting messages, with devices sending data to communication system 16. In the exemplary embodiment, processor 12 is also configured to receive data from the driver through an onboard interface 17. Onboard interface 17 may have any suitable features for receiving input from a driver and for providing information to the driver. Examples of such interface features may include a display and keypad, a touch screen display, and/or speakers and a microphone. Input from the driver may include parameters for charging vehicle battery 14, responses to alert messages, and/or other input.

In the exemplary embodiment processor 12 is also coupled to onboard sensor 18 to monitor electrical characteristics of power received through charging port 15 from an external power source 30. Onboard sensor 18 is any suitable sensor such as a current sensor and/or a voltage sensor.

Power source 30 is any suitable power source such as a 110/220 volt electrical outlet at a home or business. In one alternative embodiment, external power source 30 is coupled to vehicle 10 through a charging station 50 with a station sensor 52 that communicates with processor 12 through a station communication system 54. Charging station 50 may include equipment at a home or business, a metered charging station in a public area, or equipment available to charge vehicle 10 in other areas. Station sensor 52 may measure electrical characteristics of power provided to plug-in vehicle 10 in the same manner as onboard sensor 18. Typically the electrical characteristics measured by onboard sensor 18 will be the same as those measured by station sensor 52. If there is a significant difference between the measurements, however, an alert may be sent to the driver. In this embodiment, station sensor 52 is coupled to station communication system 54 and sends data to processor 12 through a data connection 58 that is part of a power cable 56 and connects through charging port 15 on vehicle 10. In other embodiments station communication system 54 communicates with vehicle 10 in any other suitable manner, such as a wireless RF transmission.

A difference in electrical characteristics measured at charging station 50 and vehicle 10 can indicate that charging station 50 is not measuring and metering the power correctly, that there is an electrical problem between charging station 50 and vehicle 10, or that there is tampering of the electrical connection between charging station 50 and vehicle 10. When a deviation between sensors 52 and 18 is detected, processor 12 stops the charging process and sends an alert to the driver. The alert sent to the driver allows the driver to send a response to resume charging, if desired, despite the deviation. In an alternative embodiment, when a deviation between sensors 52 and 18 is detected, the charging process does not terminate, but continues, and an alert is sent to the driver with an option to request termination of the charging process.

In the exemplary embodiment, plug-in vehicle 10 is a hybrid-electric vehicle and includes a combustion engine that uses fuel stored in a fuel storage 11. A fuel sensor 13 is coupled to processor 12 for providing the level of fuel in fuel storage 11. The level of fuel in fuel storage 11 may be used in determining whether to send an alert to the driver as discussed in further detail below.

In the exemplary embodiment processor 12 controls the recharging process for vehicle battery 14 using parameters that establish expectations for charging the vehicle. The expectations may include a schedule for charging vehicle battery 14 with a start time and a scheduled or predicted end time, and/or may include electrical characteristics of power from external power source 30 detected by onboard sensor 18. A charging expectation is any characteristic related to a charging cycle for vehicle battery 14. When deviations from the charging expectations are detected, processor 12 may continue to charge vehicle battery 14 if power is available, rather than stopping the charging process automatically. The alert sent to the driver can then provide an option to stop charging.

In one embodiment a scheduled end time is used to determine when charging expectations are not met. During a recharging cycle of vehicle battery 14, processor 12 periodically determines a projected end time based on the electrical characteristics of power from external power source 30 and a state of charge (SOC) of vehicle battery 14. The projected end time is compared to the scheduled end time and if a substantial difference exists, a message is transmitted to the driver. In an alternative embodiment an alert is sent to the driver when the scheduled end time is reached if significant charging is still required. An alert may be sent, for example, if the SOC of vehicle battery 14 is below a predetermined level at the scheduled end time.

The electrical characteristics of power from external power source 30 are also used to determine if a charging expectation is not met. In the exemplary embodiment, processor 12 compares the voltage and current measured by onboard sensor 18 to stored values of acceptable voltage and current ranges. If the measured electrical characteristics of input power are outside the acceptable ranges, then processor 12 sends an alert to the driver that charging will not take place as expected because external power source 30 is not compatible with the systems on vehicle 10 or that power is absent as may occur in a black out, brown out, or tripping of a circuit breaker. Processor 12, for example, may detect a decrease in the electrical current from external power source 30 when a power failure occurs, and may send an alert to the driver under such conditions.

In an exemplary embodiment an alert is sent to the driver when deviations occur from expected charging parameters and when the SOC of vehicle battery 14 is below a predetermined level, indicating a low battery. The predetermined battery SOC level may be based on normal commute distance of vehicle 10 or other factors. If the predetermined level is based on average/normal use of vehicle 10, then alert messages could be sent when the SOC is below the requirement for normal use of an individual vehicle, and unnecessary alerts could be reduced. Additionally the predetermined level may be determined based on adaptive logic executed by processor 12, based on many factors such as customer preference, commute patterns, driving style, pre-programmed route or destination, as well as other factors. In another embodiment the predetermined SOC level is defined by the vehicle driver.

The driver may also configure vehicle 10 to send the alert to one or more of the devices including computer 42, cell phone 44, telephone 46, or electronic key fob 20. The alert may be in any suitable format. The alert, for example, may be a text-based message in an e-mail or other text-based message, a voice mail, a voice message stored in a file that is sent or delivered through a cell phone or landline phone, and/or a visual image or message. In the exemplary embodiment the driver establishes a schedule for the alert to be sent to different electronic devices at different times to increase the likelihood that the alert will reach the driver. The alert message may indicate the nature of the error or detected deviation, and can include a request for a response. The electronic device can include a method for the driver to respond. Exemplary electronic key fob 20, for example, includes a fob display 22 and input keys 24. Cell phones, computers and other electronic devices may have conventional input devices for the driver to respond to the alert message. An electronic device, for example, may receive the alert signal from communication system 16 and displays a message with options for responses such as continue charging, or stop charging. The driver enters a response and a signal is sent back to communication system 16 with the response entered by the driver.

Figures 2, 3:
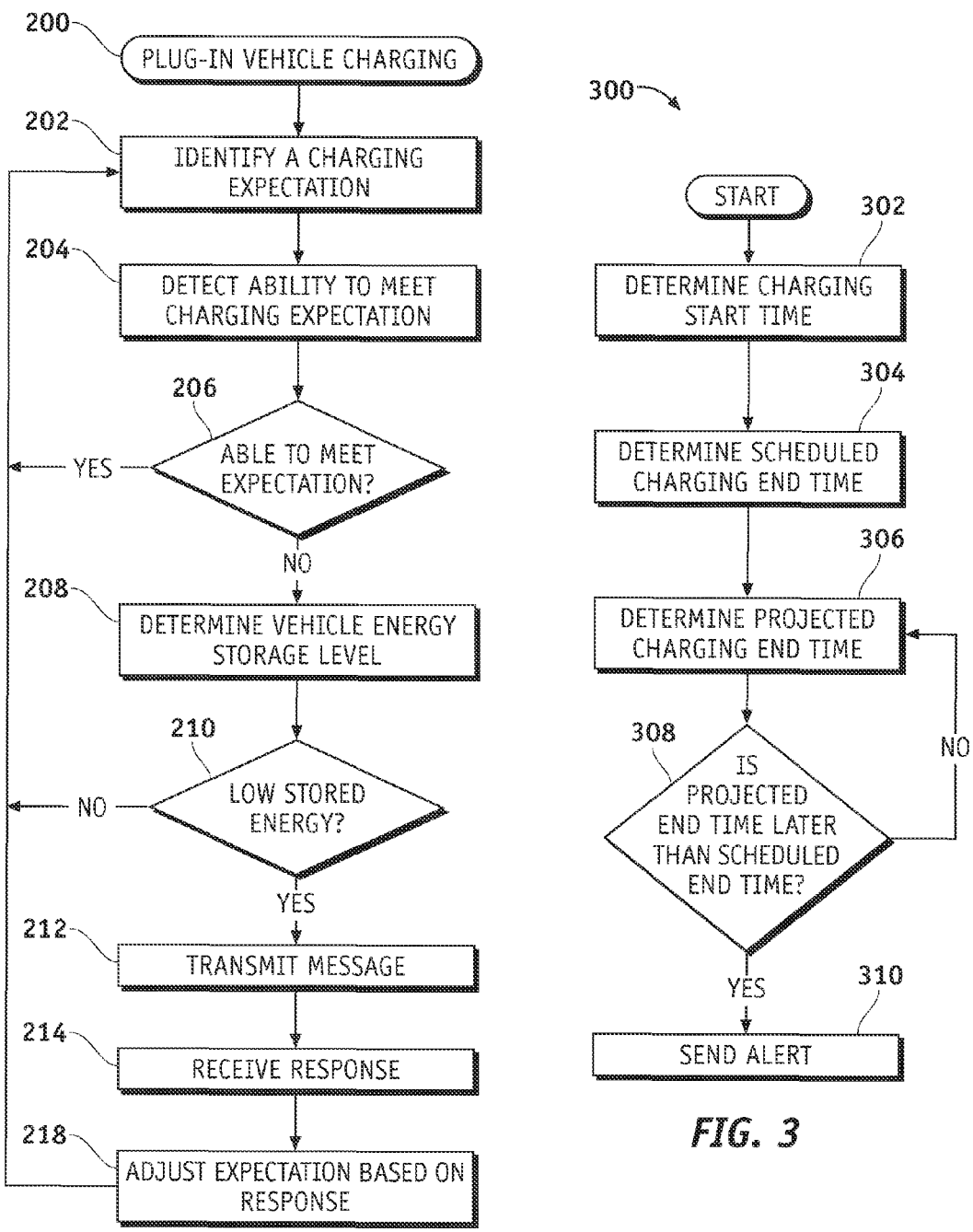
FIG. 2 is a flow chart of an exemplary method of alerting a driver of problems when charging the vehicle battery.
FIG. 3 is a flow chart of an exemplary method of alerting a driver of problems when charging based on a charging schedule.

Turning now to FIG. 2, an exemplary method 200 for charging a plug-in vehicle suitably includes the broad functions of identifying a charging expectation (function 202), detecting an ability to meet the charging expectation (function 204), and transmitting a message to a driver (function 212). Other embodiments additionally determine if the charging system is able to meet the charging expectation (function 206), determine a vehicle energy storage level (function 208), determine if the measured energy storage level is below a predetermined level (function 210), receive a response to the transmitted message (function 214) and adjust the charging expectation based on the response (function 218). Various other functions and other features may also be provided, as described in increasing detail below.

In the exemplary embodiment, processor 12 (FIG. 1) identifies a charging expectation (function 202). The charging expectation can be based on a schedule including an expected start and end time. The charging expectation can also be based on expected voltage and current from external power source 30.

Processor 12 also detects the ability of system 100 (FIG. 1) to meet the charging expectation (function 204) by comparing the charging schedule with a projected charging start time and end time based on the state of vehicle battery 14 and the voltage and current from external power source 30. Before charging begins, onboard sensor 18 measures power from charging station to determine if charging station 50 is compatible with vehicle 10. During the charging cycle, data is received from station sensor 52 as a charging expectation of power received and compared with power measured by onboard sensor 18.

In the exemplary embodiment, suitable ranges are set for the charging expectations, and processor 12 determines if system 100 is able to meet the charging expectation within the set ranges (function 206). If system 100 is able to meet the expectation, then processor 12 continues to identify charging expectations (function 202) and detect the ability to meet the expectation (function 204).

If system 100 is not able to meet the expectations (function 206), then processor 12 determines a vehicle energy storage level (function 208). In this case the vehicle is a hybrid-electric vehicle that uses combustible fuel and the energy storage level includes the level of combustible fuel in fuel storage 11 and the percentage of charge in vehicle battery 14.

The energy storage level is compared with a predetermined level (function 210) and if the energy storage is low, a message is transmitted to the driver (function 212). If the energy storage level is above the predetermined level or is not low, then processor 12 continues to identify charging expectations (function 202) and detect the ability to meet the charging expectation (function 204).

In an alternative embodiment, alerts may be sent based on any deviation from a charging parameter at any time, rather than when a low energy storage condition exists. Other preconditions to sending the alert message may also be used in other embodiments. The alert may be sent, for example, when charging is interrupted and vehicle battery 14 is low, or when vehicle battery 14 is low and the stored fuel level is low. In another embodiment the type of alert and/or frequency of alerts sent may be modified depending on battery SOC and/or fuel level. More frequent and/or more pronounced alerts, for example, may be sent when both the SOC and fuel level are low.

In the exemplary embodiment the message transmitted to the driver (function 212) includes a request for a response from the driver. The message is transmitted through multiple communication channels to devices based on predetermined settings. The alert message may be transmitted (function 214) as a text message, an e-mail, a voice message, a visual image, an audible alarm, or in other ways. The message transmitted to the driver (function 212) is any suitable message in any format. The message may be the same message for all situations, notifying the driver that there is an error charging vehicle battery 14, rather than a specific message with the nature of the error as described above.

Processor 12 receives a response (function 214) to the transmitted message and adjusts the expectations based on the response (function 216). In the exemplary embodiment when a charging expectation is not met, processor 12 stops the process of charging vehicle battery 14. The transmitted message communicates the nature of the charging expectation that was not met, and provides the driver an opportunity to direct system 100 to resume charging if possible.

If the driver responds with a request to resume charging (function 214), then processor 12 (FIG. 1) adjusts the charging expectation that was not met (function 218) to allow continued charging if the situation permits. Processor 12 then continues to identify charging expectations (function 202) and determine if the charging expectations are met (function 204).

Turning now to FIG. 3, an exemplary method 300 for using a schedule for charging a plug-in vehicle suitably includes the broad functions of determining a scheduled charging end time (function 304), determining a projected charging end time (function 306) and sending an alert to the driver (function 310). Other embodiments additionally determine a charging start time (function 302) and determine if the projected end time is later than the scheduled end time (function 308). Various other functions and features may also be provided, as described in increasing detail below.

In the exemplary method of FIG. 3, the charging schedule is used for a charging expectation. Processor 12 may determine a charging start time (function 302) based on factors such as a predetermined schedule, the cost for available electricity at various times, vehicle battery characteristics including state of charge, and/or other factors. The length of time needed to charge vehicle battery 14 may be calculated using the available current and voltage from external power source 30. In the exemplary embodiment, processor 12 determines a scheduled charging end time (function 304) using the charging start time and the calculated charging length of time. In other embodiments the scheduled charging end time may be according to a pre-determined schedule or determined using other suitable methods. A charging schedule, for example, may be pre-determined with a scheduled start time at 1:00 am and a scheduled charging end time of 6:00 am.

As vehicle battery 14 is charged, processor 12 continues to receive data from onboard sensor 18 regarding the current and/or voltage received, as well as data from vehicle battery 14 regarding battery state of charge. Processor 12 may use the received data to determine a projected charging end time (function 306). In the exemplary embodiment the projected end time is then compared to the scheduled end time (function 308) to determine if charging will be completed by the scheduled end time. If the projected end time is before or the same as the scheduled end time, then processor 12 continues to compare the projected end time to the scheduled end time (function 308). If the projected end time is later than the scheduled end time, then processor 12 sends an alert to the driver (function 310) through vehicle communication system 16 as discussed in other embodiments.

Generally speaking, the various functions and features of methods 200 and 300 may be carried out with any sort of hardware, software and/or firmware logic that is stored and/or executed on any platform. Some or all of method 200 and method 300 may be carried out, for example, by logic executing within vehicle 10 in FIG. 1. In one embodiment, processor 12 executes software logic that performs each of the various functions shown in FIGS. 2 and 3. Such logic may be stored in processor 12 or in any storage available to processor 12 as desired. Hence, the particular logic and hardware that implements any of the various functions shown in FIGS. 2 and 3 may vary from context to context, implementation to implementation, and embodiment to embodiment in accordance with the various features, scenarios and structures set forth herein. The particular means used to implement each of the various functions shown in FIGS. 2 and 3, then, could be any sort of processing structures that are capable of executing conventional software logic in any format. Such processing hardware may include processor 12 or other components of vehicle 10 in FIG. 1, as well as any other processors or other components associated with any conventional vehicle, battery charging system, communication system and/or the like.

While at least one exemplary embodiment has been presented in the foregoing detailed description, it should be appreciated that a vast number of variations exist. External power source 30, for example, may be any suitable external power source; a plug socket at home or a public charging station may provide power for recharging vehicle battery 14. Vehicle charging may start immediately when vehicle 10 is connected to external power source 30, rather than at a delayed time as part of a charging schedule as described above.

It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A charging system for use in a plug-in vehicle and configured to charge a vehicle battery from an external power source that is not onboard the vehicle, the charging system comprising:
   a first sensor disposed onboard the plug-in vehicle and configured to detect a first measure of an electrical current received from the external power source, the first measure detected by the first sensor onboard the vehicle;
   a second sensor disposed at the external power source and configured to detect a second measure of the electrical current at the external power source, the second measure detected by the second sensor at the external power source;
   a processor configured to:
      compare the first measure with the second measure, generating a comparison;
      determine a charging expectation related to charging the vehicle battery;
      determine a variation from the charging expectation based on the comparison; and
      direct transmission of a message based on the variation from the charging expectation; and
   a remote electronic device configured to receive the message and to alert a driver of the plug-in vehicle based on the message.

2. The charging system of claim 1 wherein the remote electronic device is an electronic key fob configured to communicate with the charging system.

3. The charging system of claim 1 comprising a communication system that communicates through a cellular telephone network, the communication system configured to transmit the message via the cellular telephone network to the remote electronic device based on the electrical current.

4. The charging system of claim 1, wherein the processor is further configured to:
   determine the charging expectation based on the electrical current and an onboard parameter; and
   direct transmission of the message based on the electrical current detected by the sensor and the variation from the charging expectation.

5. The charging system of claim 1, wherein the processor is further configured to identify the expectation using a schedule for charging the battery.

6. The charging system of claim 5, wherein:
   the schedule includes a scheduled charging end time; and
   the processor is further configured to:
      determine a projected charging end time using the electrical current;
      compare the scheduled charging end time with the projected charging end time; and
      direct transmission of the message based on a difference between the scheduled charging end time and the projected charging end time.

7. The charging system of claim 1, wherein the processor is further configured to:
   detect an ability to meet the expectation based on the electrical current and the onboard parameter; and
   direct transmission of the message if the ability to meet the expectation is not detected.

8. The charging system of claim 7, wherein the processor is further configured to detect the ability to meet the expectation by measuring a decrease in the electrical current from the external power source.

9. The charging system of claim 7, wherein the processor is further configured to direct termination of the charging of the electric vehicle based on the ability to meet the expectation.

10. The charging system of claim 1, wherein the processor is further configured to:
    determine a state of charge of the battery; and
    direct transmission of the message if the state of charge is less than a predetermined threshold.

11. The charging system of claim 1, wherein the message comprises an inquiry to a user of the plug-in vehicle as to whether to continue charging the battery.

12. The charging system of claim 1, wherein the processor is further configured to:
    receive a response from a user of the plug-in vehicle; and
    adjust the charging expectation based on the response.

13. A charging system for use in a plug-in vehicle and configured to charge a vehicle battery from an external power source comprising:
    a sensor configured to detect an electrical current received from the external power source;
    a processor configured to:

identify a charging expectation related to charging the vehicle battery using a schedule for charging the battery; the schedule including a scheduled charging end time;

determine a projected charging end time using the electrical current;

compare the scheduled charging end time with the projected charging end time; and direct transmission of a message based on a difference between the scheduled charging end time and the projected charging end time; and a remote electronic device configured to receive the message and to alert a driver of the plug-in vehicle based on the message.

14. The charging system of claim 13, wherein the remote electronic device is an electronic key fob configured to communicate with the charging system.

15. A charging system for use in a plug-in vehicle and configured to charge a vehicle battery from an external power source that is not onboard the vehicle, the charging system comprising:

a sensor configured to detect an electrical current received from the external power source;

a processor configured to:

determine an electrical current charging expectation related to charging the vehicle battery based on the electrical current;

determine a variation from the charging expectation based on the electrical current, and direct transmission of a message based on the electrical current detected by the sensor and the variation from the charging expectation; and a remote electronic device configured to receive the message and to alert a driver of the plug-in vehicle based on the message.

16. The charging system of claim 15, wherein the remote electronic device is an electronic key fob configured to communicate with the charging system.

17. The charging system of claim 15, wherein the processor is further configured to identify the expectation using a schedule for charging the battery.

18. The charging system of claim 17, wherein:

the schedule includes a scheduled charging end time; and the processor is further configured to:

determine a projected charging end time using the electrical current;

compare the scheduled charging end time with the projected charging end time; and direct transmission of the message based on a difference between the scheduled charging end time and the projected charging end time.

19. The charging system of claim 17, wherein the processor is further configured to detect the ability to meet the expectation by measuring a decrease in the electrical current from the external power source.

20. The charging system of claim 17, wherein:

the sensor is disposed onboard the plug-in vehicle, and is configured to detect a first measure of the electrical current onboard the vehicle;

the charging system further includes a second sensor disposed at the external power source and configured to detect a second measure of the electrical current at the external power source; and the processor is further configured to:

compare the first measure with the second measure; and direct transmission of the message based on a difference between the first and second measures.

* * * * *